United States Patent
Zhao et al.

(10) Patent No.: US 11,611,720 B2
(45) Date of Patent: Mar. 21, 2023

(54) DISPLAY PANEL AND ELECTRONIC DEVICE

(71) Applicant: Wuhan China Star Optoelectronics Semiconductor Display Technology Co., Ltd., Hubei (CN)

(72) Inventors: Yong Zhao, Hubei (CN); Zuomin Liao, Hubei (CN); Tao Chen, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 445 days.

(21) Appl. No.: 16/624,805

(22) PCT Filed: Nov. 7, 2019

(86) PCT No.: PCT/CN2019/116131
§ 371 (c)(1),
(2) Date: Dec. 19, 2019

(87) PCT Pub. No.: WO2021/027110
PCT Pub. Date: Feb. 18, 2021

(65) Prior Publication Data
US 2021/0360194 A1 Nov. 18, 2021

(30) Foreign Application Priority Data
Aug. 9, 2019 (CN) .......................... 201910735995.9

(51) Int. Cl.
*H04N 7/14* (2006.01)
*G03B 17/48* (2021.01)
*H01L 27/32* (2006.01)

(52) U.S. Cl.
CPC ............. *H04N 7/144* (2013.01); *G03B 17/48* (2013.01); *H01L 27/3234* (2013.01); *H01L 27/3276* (2013.01)

(58) Field of Classification Search
CPC . G06F 1/16; H04M 1/02; G03B 17/48; H04N 7/144; H04N 7/14
(Continued)

(56) References Cited

U.S. PATENT DOCUMENTS

2019/0095674 A1* 3/2019 Ko ..................... G02B 19/0009

FOREIGN PATENT DOCUMENTS

| CN | 107342036 A | 11/2017 |
| CN | 107346152 A | 11/2017 |

(Continued)

*Primary Examiner* — Yosef K Laekemariam
(74) *Attorney, Agent, or Firm* — Geoffrey Lottenberg; Berger Singerman LLP (57) ABSTRACT

The present invention discloses a display device and a manufacturing method thereof, the display device has a camera region and a displaying region surrounding the camera region, and has a cover plate; a transparent release agent layer disposed on the cover plate and is located in the camera region; a display function structural layer disposed on a surface of the cover plate with the transparent release agent layer; a protective adhesive layer disposed on the display function structural layer, and the protective adhesive layer having a first through hole corresponding to a region of the transparent release agent layer; the display function structural layer having a second through hole corresponding to the region of the transparent release agent layer.

19 Claims, 8 Drawing Sheets

(58) Field of Classification Search
USPC ............ 348/14.01, 211.12, 333.01, 575, 739
See application file for complete search history.

(56) References Cited

FOREIGN PATENT DOCUMENTS

| CN | 109065582   | * 12/2018 | ............ H01L 27/32  |
| CN | 208607570   | * 12/2018 | ............... G06F 1/16 |
| CN | 109360840 A |   2/2019  |                          |
| CN | 208607570   | *  3/2019 | ......... H01L 27/3218   |
| CN | 208607570 U |   3/2019  |                          |
| CN | 109801950 A |   5/2019  |                          |

* cited by examiner

DISPLAY PANEL AND ELECTRONIC DEVICE

CROSS-REFERENCE TO RELATED APPLICATIONS

This application is the National phase under 35 U.S.C. § 371 of International Application No. PCT/CN2019/116131, filed Nov. 7, 2019, which claims the benefit of and priority to Chinese Patent Application No. 201910735995.9, filed Aug. 9, 2019. The entire contents of these patent applications are hereby incorporated by reference herein.

FIELD OF INVENTION

The present invention relates to a field of display technologies, especially to a display device and a manufacturing method thereof.

BACKGROUND OF INVENTION

With development of technologies, and people's increasing requirements for products, a full screen with higher screen ratio becomes the most expected developing trend of smart phones. How to set a front camera while achieving the full screen is the difficulty of such technology. The front camera requires the display screen to preserve a transparent region in the display screen to allow light to pass therethrough, and the display screen cannot display images in this region, which lowers the screen ratio. To improve the screen ratio of the full screen, an under-screen camera technology has been developed and requires defining a hole in a rear of the display screen for placing the camera.

During Bonding an optical adhesive layer, a polarizer and a backplate each of which has a hole, particle pollution occurs, bonding pictures cannot be precisely aligned, an edge of the hole has cracks due to stress, which makes the process difficult. Because of the bonding process, a tolerance increased, a misalignment region of edges of the holes increases such that the holes are difficult to be aligned with one another, which decreases an effective area of a displaying region of the display screen.

SUMMARY OF INVENTION

Technical Issue

To solve the above technical issue: the present invention provides a display device and a manufacturing method thereof that dispose a transparent release agent layer in a camera region of a cover plate such that a cover plate is integrally formed on a display function structural layer, and then a through hole is defined in the display function structural layer for installation of a camera, which lowers difficulty of alignment of bonded layers of the display function structural layer and increases an effectively of a displaying region.

Technical Solution

A technical solution for solving the above technical issue is as follows. The present invention provides a display device, the display device comprises a camera region and a displaying region surrounding the camera region, and the display device comprises: a cover plate; a transparent release agent layer disposed on the cover plate and located in the camera region; a display function structural layer disposed on a surface of the cover plate with the transparent release agent layer; a protective adhesive layer disposed on the display function structural layer, wherein a first through hole is defined in a region of the protective adhesive layer corresponding to the transparent release agent layer, and a second through hole is defined in a region of the display function structural layer corresponding to the transparent release agent layer.

In an embodiment of the present invention, the display function structural layer comprises: an optical adhesive layer disposed on the transparent release agent layer and the cover plate; a polarizer disposed on the optical adhesive layer; a polyimide layer disposed on the polarizer; a backplate disposed on the polyimide layer, wherein the protective adhesive layer is disposed on the backplate.

In an embodiment of the present invention, a thickness of the transparent release agent layer ranges from 1 um to 30 um.

In an embodiment of the present invention, an optical transmittance of the transparent release agent layer is greater than or equal to 92%, and an ab color shift of the transparent release agent layer is less than 1.

In an embodiment of the present invention, the protective adhesive layer is a three-in-one adhesive tape.

In an embodiment of the present invention, a material of the optical adhesive layer on the cover plate of the displaying region comprises solid adhesive, and a material of the optical adhesive on the transparent release agent layer of the camera region comprises solid adhesive or liquid adhesive.

The present invention also provides for manufacturing the display device as claimed in claim 1, comprising steps as follows: providing the cover plate, and forming the transparent release agent layer in the camera region of the cover plate; forming the display function structural layer, and bonding the display function structural layer to the surface of the cover plate with the transparent release agent layer; attaching and disposing the protective adhesive layer on the display function structural layer, wherein the first through hole is defined in the protective adhesive layer in the region corresponding to the transparent release agent layer; and defining a hole in the display function structural layer corresponding to the first through hole such that the second through hole extending to a surface of the transparent release agent layer is defined.

In an embodiment of the present invention, the step of forming the display function structural layer comprises steps as follows: forming an optical adhesive layer on the transparent release agent layer and on the surface of the cover plate with the transparent release agent layer; forming a polarizer on the optical adhesive layer; forming a polyimide layer on the polarizer; and forming a backplate on the polyimide layer.

In an embodiment of the present invention, the step of forming an optical adhesive layer comprises coating liquid adhesive or solid adhesive on the transparent release agent layer, coating solid adhesive on the surface of the cover plate with the transparent release agent layer, curing the coating liquid adhesive or the solid adhesive and the solid adhesive to form the optical adhesive layer.

In an embodiment of the present invention, the step of defining the hole in the display function structural layer comprises cutting the display function structural layer to define the hole in the display function structural layer by carbon dioxide laser or ultraviolet.

Advantages

The display device and the manufacturing method thereof of the present invention, by forming a transparent release agent layer on a camera region of a cover plate, then integrally forming a manufactured display function structural layer on the cover plate, and then defining a second through hole corresponding to the transparent release agent layer one time with the second through hole defined all layers of the display function structural layer, form precisely aligned openings with the same size and shape in the layers respectively. Because existence of the transparent release agent layer, scraps generated from laser cutting can be effectively removed quickly. In the real manufacture, an aligning step of through holes in a conventional display function structural layer is omitted, which increases alignment precision of edges of through holes of the display function structural layer and further increases the effective area of the displaying region.

DESCRIPTION OF DRAWINGS

To more clearly elaborate on the technical solutions of embodiments of the present invention or prior art, appended figures necessary for describing the embodiments of the present invention or prior art will be briefly introduced as follows. Apparently, the following appended figures are merely some embodiments of the present invention. A person of ordinary skill in the art may acquire other figures according to the appended figures without any creative effort.

REFERENCE NUMERAL 1 display device; 101 displaying region;
102 camera region; 11 cover plate;
12 transparent release agent layer; 13 display function structural layer;
14 protective adhesive layer; 140 first through hole;
130 second through hole; 131 optical adhesive layer;
132 polarizer; 133 polyimide layer;
134 backplate.

DETAILED DESCRIPTION OF PREFERRED EMBODIMENTS

Embodiments of the present invention will be described in details. Examples of the embodiments are illustrated in the accompanying drawings. The same or similar reference characters refer to the same or similar elements or elements including the same or similar functions. The following embodiments described with reference to the accompanying drawings are exemplary, are only configured to construe the present invention and cannot be understood as limitations to the present invention.

The embodiments as follows refer to the accompanying drawings for illustrating specific embodiments of the present invention that can be embodied. Directional terminologies mentioned by the present invention, for example "upper", "lower", "front", "rear", "left", "right", "top", "bottom", etc., only refer to directions of the accompanying drawings. Therefore, the employed directional terminologies are configured to indicate and make understanding for the present invention but is not for limiting the present invention.

Figure 5:
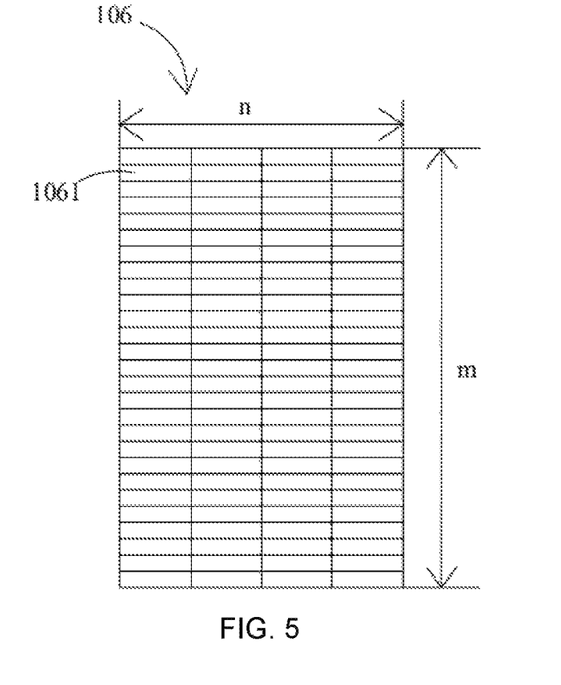
FIG. 5 is a structural view of a display device of the embodiment of the present invention formed with a second through hole, and an arrow in the figure is a direction of a laser irradiation.
Figure 6:
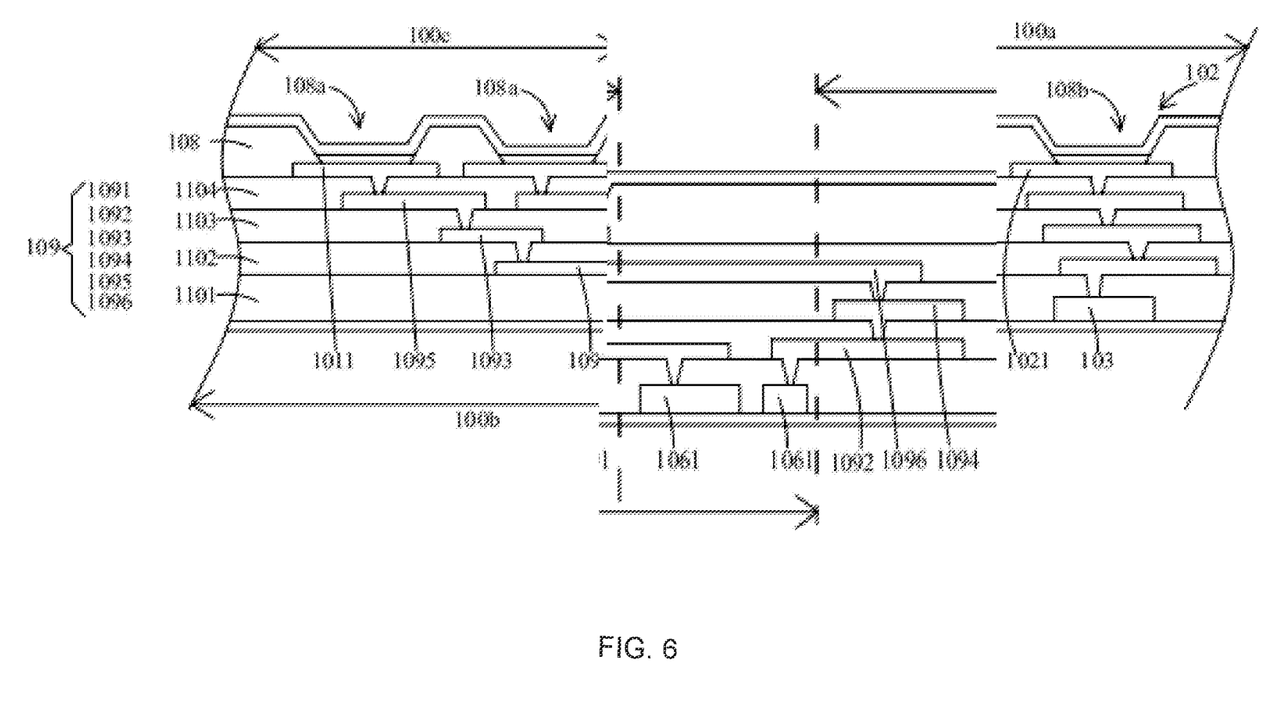
Figure 7:
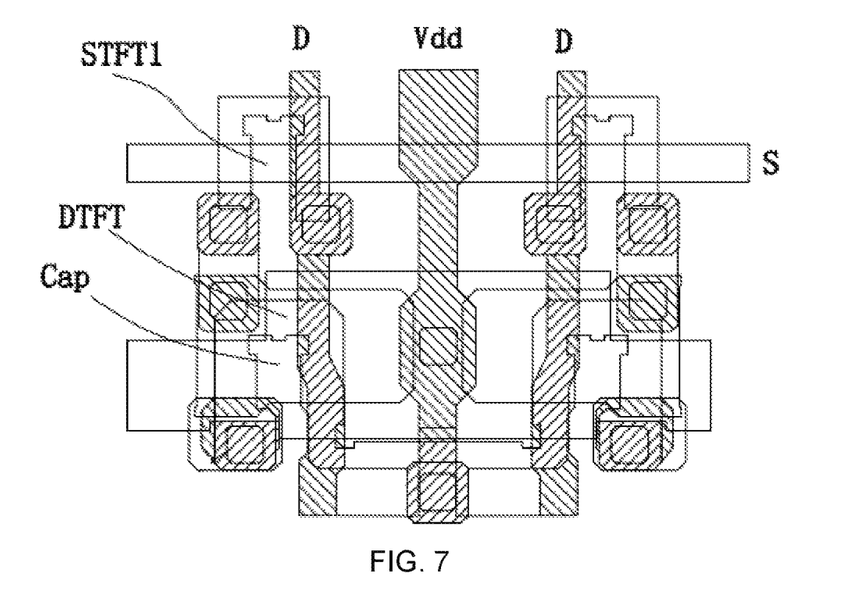
Figure 8:
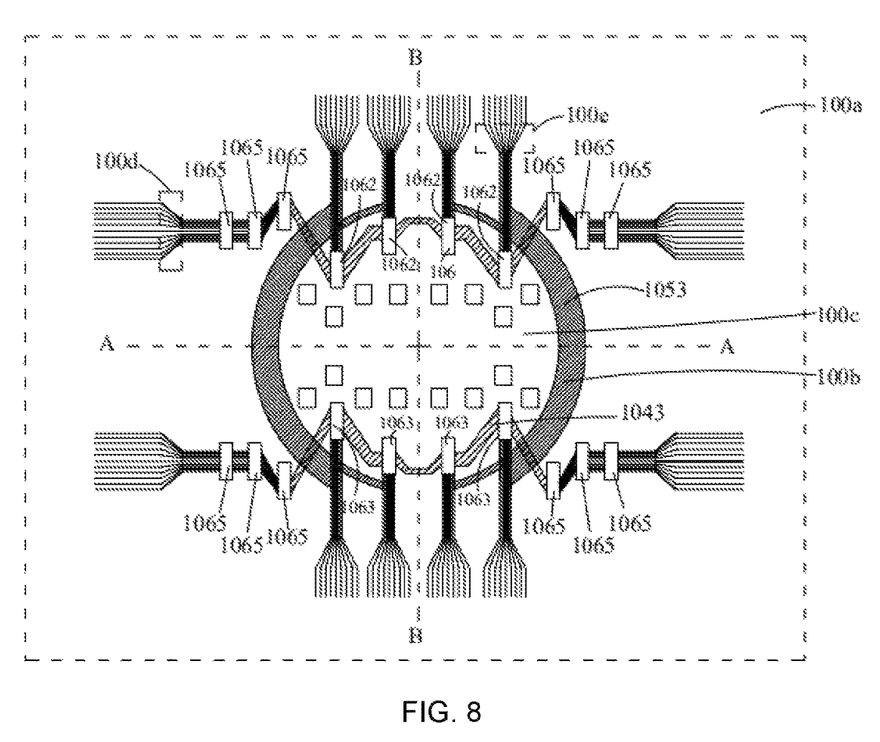
Figure 9:
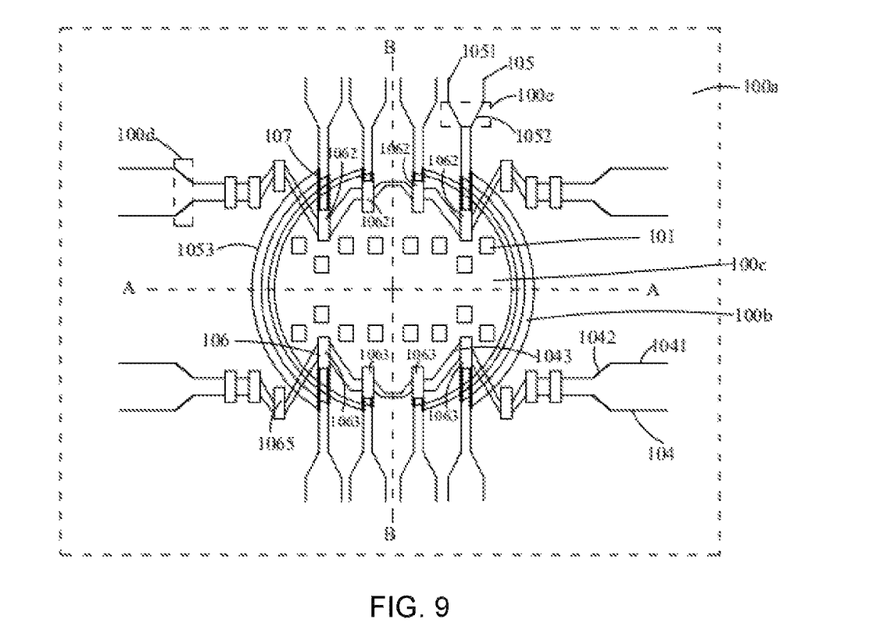
Figure 10:
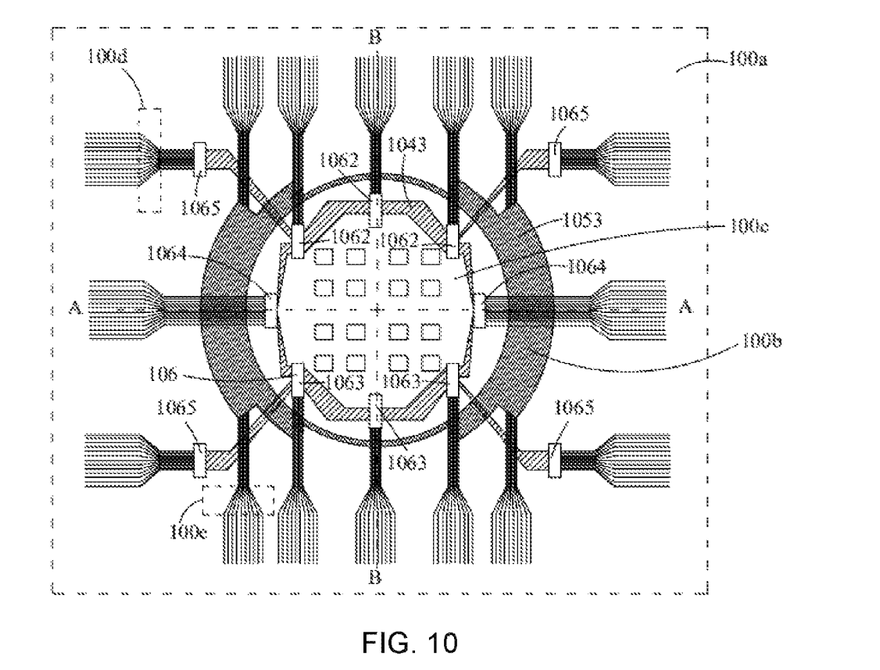

With reference to FIG. 5, in an embodiment, a display device 1 of the present invention comprises a camera region 102 and a displaying region 101 surrounding the camera region 102. The display device 1 comprises a cover plate 11, a transparent release agent layer 12, a display function structural layer 13, and a protective adhesive layer 14.

Figure 1:
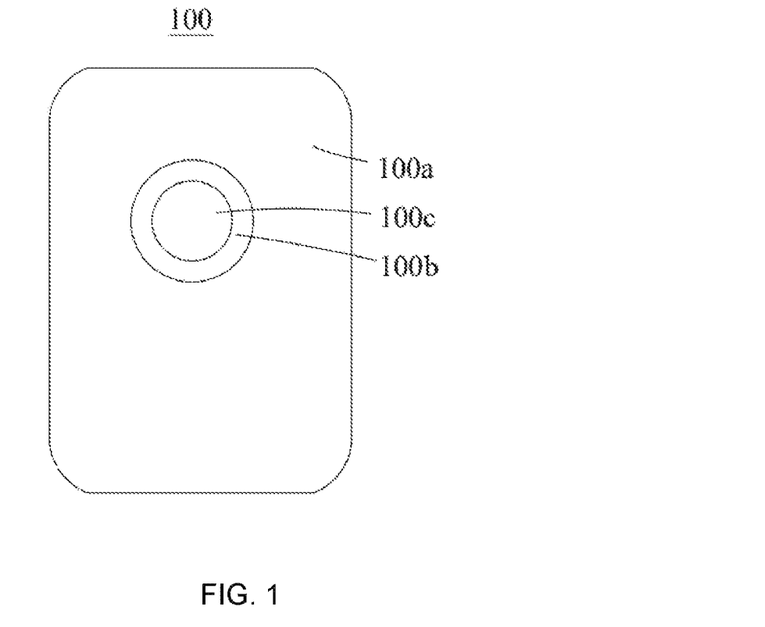
FIG. 1 is a structural view of a transparent release agent layer formed on a cover plate of an embodiment of the present invention.
Figure 2:
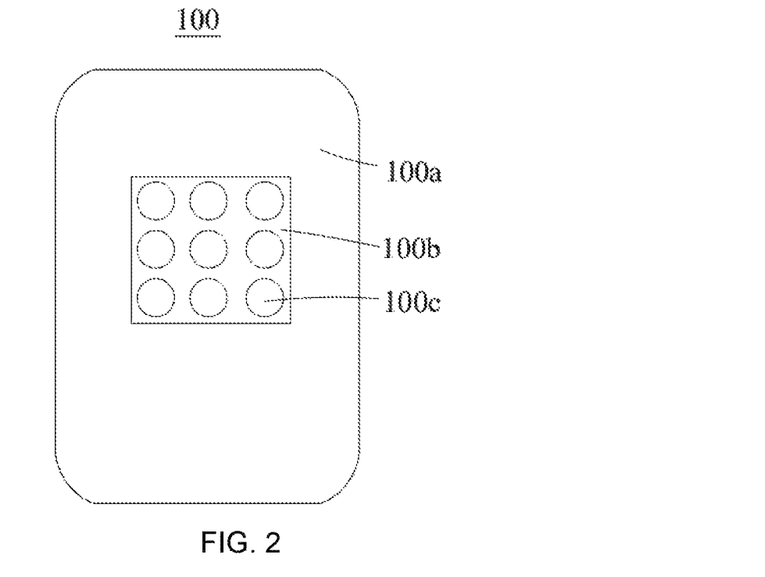
FIG. 2 is a top view of FIG. 1.

With reference to FIGS. 1 and 2, the transparent release agent layer 12 is disposed on the cover plate 11 and is located in the camera region 102. In general, the camera region 102 is circular, and the transparent release agent layer 12 is also circular. A thickness of the transparent release agent layer 12 ranges from 1 um to 30 um. An optical transmittance of the transparent release agent layer 12 is greater than or equal to 92%. An ab color shift of the transparent release agent layer 12 is less than 1. In the present embodiment, the transparent release agent can optionally use one of an organic silicon release agent, a fluorine release agent, and an ultraviolet (UV) release agent.

Figure 3:
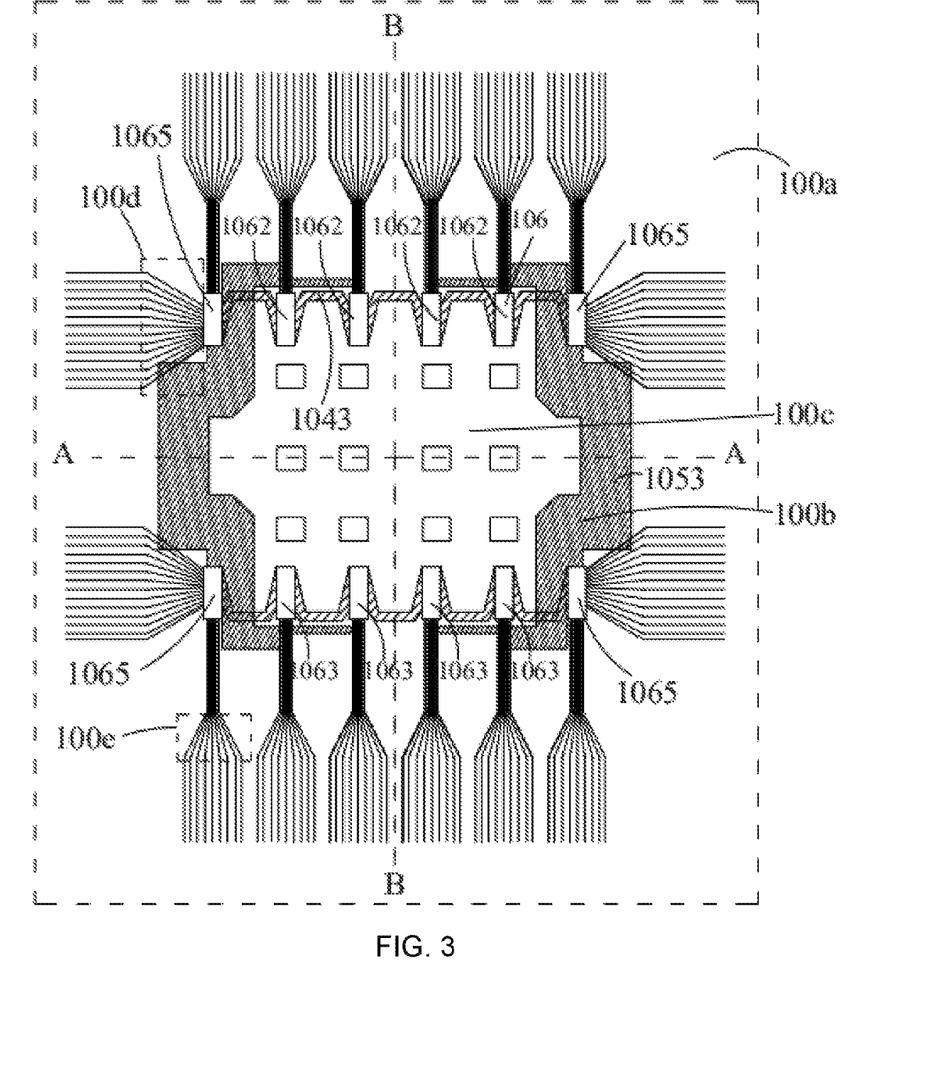
FIG. 3 is a structural view of a display device of the embodiment of the present invention formed with a display function structural layer.

With reference to FIG. 3, the display function structural layer 13 is disposed on a surface of the cover plate 11 with the transparent release agent layer 12. More specifically, the display function structural layer 13 comprises an optical adhesive layer 131, a polarizer 132, a polyimide layer 133, and a backplate 134. The optical adhesive layer 131 is disposed on the transparent release agent layer 12 and the cover plate 11. A material of the optical adhesive layer 131 can comprise solid adhesive, or liquid adhesive, or a combination of liquid adhesive and solid adhesive. Because the transparent release agent layer 12 has a certain thickness, if all the layer of the optical adhesive layer 131 employs the solid adhesive, the optical adhesive layer 131 is easily bulged partially on the transparent release agent layer 12. Therefore, in the present embodiment, the optical adhesive layer 131 employs the liquid adhesive in a region of the transparent release agent layer 12, and the optical adhesive layer 131 employs the solid adhesive in other region. As such, a surface of the formed the optical adhesive layer 131 is flat, which advantages a later bonding of the polarizer 132. The polarizer 132 is bonded to the optical adhesive layer 131. The polyimide layer 133 is disposed on the polarizer 132. The backplate 134 is disposed on the polyimide layer 133. In the present embodiment, the backplate 134 comprises a color filter substrate, a liquid crystal layer, and an array substrate.

Figure 4:
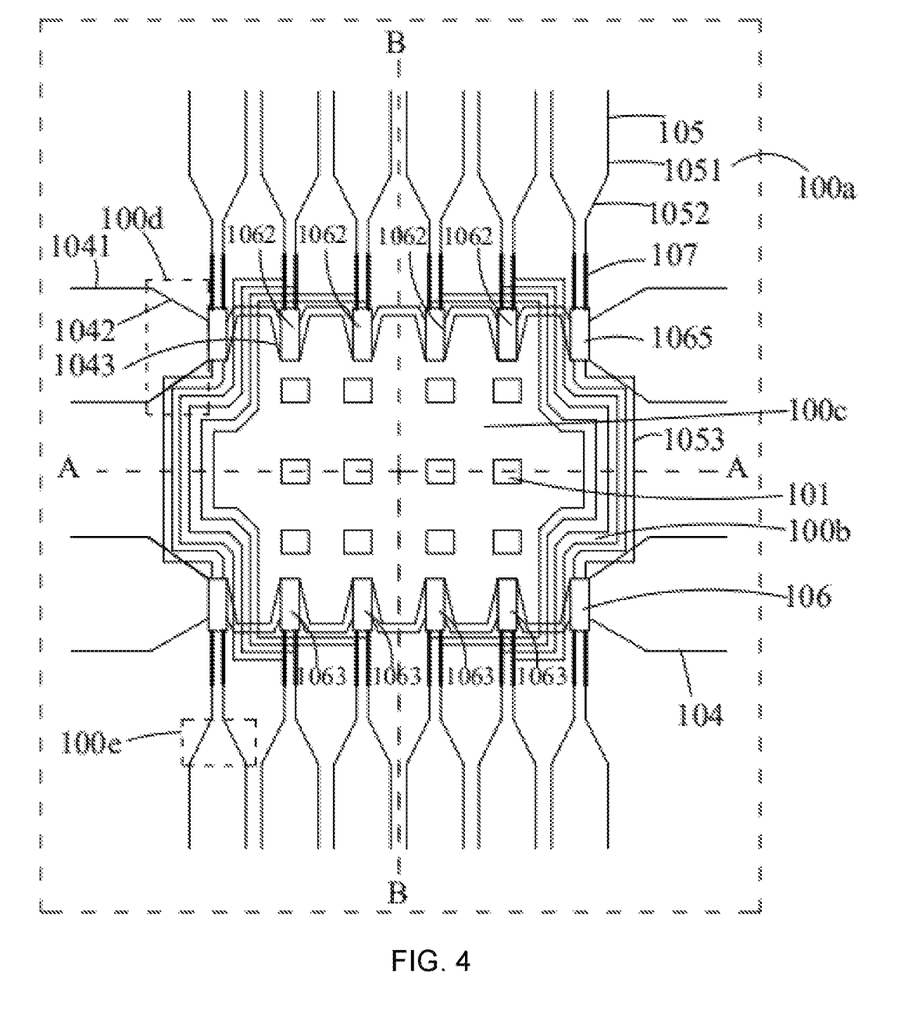
FIG. 4 is a structural view of a display device of the embodiment of the present invention formed with a protective adhesive layer.

With reference to FIG. 4, the protective adhesive layer 14 is disposed on the display function structural layer 13. Specifically, the protective adhesive layer 14 is disposed on the backplate 134. in the present embodiment, the protective adhesive layer 14 employs a three-in-one adhesive tape.

A first through hole 140 is defined in a region of the protective adhesive layer 14 corresponding to the transparent release agent layer 12. A second through hole 130 is defined in a region of the display function structural layer 13 corresponding to the transparent release agent layer 12. The first through hole 140 and the second through hole 130 serve as installation holes for the camera.

To more explicitly describe the display device 1 of the present invention, the present invention also provides a manufacturing method for the display device 1.

The manufacturing method of the present invention comprises steps as follows.

With reference to FIGS. 1 and 2, providing a cover plate 11 is performed, and forming a transparent release agent layer 12 in the camera region 102 of the cover plate 11 is performed. Disposing the transparent release agent layer 12 on the cover plate 11 with the transparent release agent layer 12 located in the camera region 102 is performed. A thickness of the transparent release agent layer 12 ranges from 1 um to 30 um, and is preferably 10 um or 15 um. An optical transmittance of the transparent release agent layer 12 is greater than or equal to 92%. An ab color shift of the transparent release agent layer 12 is less than 1. In the present embodiment, the transparent release agent can be one of an organic silicon release agent, a fluorine release agent, and an ultraviolet (UV) release agent.

With reference to FIG. 3, forming the display function structural layer 13 is performed, and bonding the display function structural layer 13 to a surface of the cover plate 11 with the transparent release agent layer 12 is performed. Specifically, the step of forming the display function structural layer 13 comprises forming an optical adhesive layer 131 on the transparent release agent layer 12 and on the surface of the cover plate 11 with the transparent release agent layer 12. The step of forming the optical adhesive layer 131 comprises coating liquid adhesive or solid adhesive on the transparent release agent layer 12. Because the transparent release agent layer 12 has a certain thickness, if all the layer of the optical adhesive layer 131 employs the solid adhesive, the optical adhesive layer 131 is easily bulged partially on the transparent release agent layer 12. Therefore, in the present embodiment, the optical adhesive layer 131 employs the liquid adhesive in a region of the transparent release agent layer 12, and the optical adhesive layer 131 employs the solid adhesive in other region. As such, a surface of the formed the optical adhesive layer 131 is flat, which advantages a later bonding of the polarizer 132. The polarizer 132 is bonded to the optical adhesive layer 131. The polyimide layer 133 is disposed on the polarizer 132. The backplate 134 is disposed on the polyimide layer 133. In the present embodiment, the backplate 134 comprises a color filter substrate, a liquid crystal layer, and an array substrate.

With reference to FIG. 4, attaching and disposing a protective adhesive layer 14 on the display function structural layer 13 in a region corresponding to the transparent release agent layer 12 is performed, and the protective adhesive layer 14 has a first through hole 140. A size and a shape of the first through hole 140 are the same as those of the region corresponding to the transparent release agent layer 12.

With reference to FIG. 5, defining a hole in the display function structural layer 13 corresponding to the first through hole 140 such that a second through hole 130 extending to a surface of the transparent release agent layer 12 is defined. When the hole is defined, the step of defining the hole in the display function structural layer 13 employs carbon dioxide laser or ultraviolet to cut the display function structural layer 13 to define the hole. The protective adhesive layer 14 facilitates protection a region other than the first through hole 140 from being damaged by the laser such that an area of the second through hole 130 is limited within an extent of the first through hole 140. Because the display function structural layer 13 is integrally installed on the cover plate 11, in the display function structural layer 13, the second through hole 130 is defined through each layer of the display function structural layer 13 and form precisely aligned openings with the same size and shape in the layers respectively. Because existence of the transparent release agent layer 12, scraps generated from laser cutting can be effectively removed quickly.

The above descriptions are only the preferred embodiments of the present invention, and are not intended to limit the present invention. Any modifications, equivalents, and improvements made within the spirit and scope of the present invention should be included in the protective extent of the present invention.

What is claimed is:

1. A display panel, comprising:
   a functional additional area comprising at least one display light-transmissive area;
   a plurality of first display pixels disposed on the at least one display light-transmissive area; and
   a plurality of pixel driving circuit islands, a plurality of first signal lines, and a plurality of second signal lines disposed at a periphery of the at least one display light-transmissive area;
   wherein each of the pixel driving circuit islands comprises a plurality of first pixel driving circuits;
   the plurality of first signal lines and the plurality of second signal lines are both electrically connected to the plurality of first pixel driving circuits of the plurality of pixel driving circuit islands;
   at least part of the first pixel driving circuits of at least part of the pixel driving circuit islands is used for driving the plurality of first display pixels in the at least one display light-transmissive area to illuminate; and
   wherein an interval between two adjacent first pixel driving circuits of each of the pixel driving circuit islands is smaller than an interval between any two adjacent first display pixels, and an interval between two adjacent pixel driving circuit islands is greater than the interval between any two adjacent first display pixels.

2. The display panel as claimed in claim 1, wherein each of the first signal lines comprises a first roundabout, each of the second signal lines comprises a second roundabout, and the first roundabout and the second roundabout are formed on different layers; and
   a plurality of first roundabouts of the plurality of first signal lines are disposed on an edge of the at least one display light-transmissive area, and a plurality of second roundabouts of the plurality of second signal lines are disposed on the edge of the at least one display light-transmissive area.

3. The display panel as claimed in claim 2, wherein the second roundabouts of the plurality of second signal lines are disposed around at least part of an area of the at least one display light-transmissive area, and at least part of the pixel driving circuit islands are disposed in an area surrounded by the second roundabouts of the plurality of second signal lines.

4. The display panel as claimed in claim 2, wherein the at least one display light-transmissive area is an axis-symmetric area, the at least one display light-transmissive area is axis-symmetric about a first symmetric axis and a second symmetric axis, and the first symmetric axis and the second symmetric axis are vertical with one another,
   the first roundabouts of the plurality of first signal lines are divided into two groups, and the two groups of the first roundabouts are symmetrically disposed on opposite edges of the at least one display light-transmissive area about the first symmetric axis; and the second roundabouts of the plurality of second signal lines are divided into two groups, and the two groups of the second roundabouts are symmetrically disposed on the edge of the at least one display light-transmissive area about the second symmetric axis.

5. The display panel as claimed in claim 4, wherein at least part of the pixel driving circuit islands are disposed on the edge of the at least one display light-transmissive area, the at least part of the pixel driving circuit islands comprises a first group of pixel driving circuit islands and a second group of pixel driving circuit islands, the at least part of the pixel driving circuit islands in the first group of pixel driving circuit islands and the at least part of the pixel driving circuit islands in the second group of pixel driving circuit islands are symmetrically disposed on the opposite edges of the at least one display light-transmissive area about the first symmetric axis, one group of the first roundabouts in sequence is electrically connected to each of the at least part of the pixel driving circuit islands in the first group of pixel driving circuit islands, and another group of the first roundabouts in sequence is electrically connected to each of the at least part of the pixel driving circuit islands in the second group of pixel driving circuit islands, and two ends of each group of the second roundabouts are respectively electrically connected to the at least part of the pixel driving circuit islands of the first group of pixel driving circuit islands and the second group of pixel driving circuit islands symmetrically disposed with one another.

6. The display panel as claimed in claim 5, wherein an edge of the first roundabouts is relative to a display area corresponding to a protrusion or a depression of an edge of the at least part of the pixel driving circuit islands in the first group of pixel driving circuit islands and the second group of pixel driving circuit islands.

7. The display panel as claimed in claim 5, wherein the first group of pixel driving circuit islands and the second group of pixel driving circuit islands are both arranged in rows, or the first group of pixel driving circuit islands and the second group of pixel driving circuit islands are both arranged in an arc shape.

8. The display panel as claimed in claim 5, wherein the at least part of the pixel driving circuit islands is disposed at the edge of the at least one display light-transmissive area in a ring shape, the second roundabouts of the plurality of second signal lines are disposed around a periphery of the at least part of the pixel driving circuit islands and electrically connected to all pixel driving circuit islands in the at least part of the pixel driving circuit islands, and the first roundabouts of the plurality of first signal lines are in sequence electrically connected to any two adjacent pixel driving circuit islands in the at least part of the pixel driving circuit islands.

9. The display panel as claimed in claim 8, wherein the at least part of the pixel driving circuit islands comprises a third group of pixel driving circuit islands, pixel driving circuit islands of the third group of pixel driving circuit islands are disposed on the first symmetric axis and symmetrically disposed about the second symmetric axis, one group of the first roundabouts comprises a first-cluster of first roundabouts and a second-cluster of first roundabouts, another group of first roundabouts comprises a third-cluster of first roundabouts and a fourth-cluster of first roundabouts, the first-cluster of first roundabouts is in sequence electrically connected to the at least part of the pixel driving circuit islands in the first group of pixel driving circuit islands, the second-cluster of first roundabouts is electrically connected to the at least part of the pixel driving circuit islands in the first group of pixel driving circuit islands and the third group of pixel driving circuit islands, the third-cluster of first roundabouts is in sequence electrically connected to the at least part of the pixel driving circuit islands in the second group of pixel driving circuit islands, and the fourth-cluster of first roundabouts is electrically connected to the at least part of the pixel driving circuit islands in the second group of pixel driving circuit islands and the third group of pixel driving circuit islands, and each group of the second roundabouts comprises at least three clusters of the second roundabouts of different lengths, one cluster of the second roundabouts is electrically connected to the pixel driving circuit islands in the third group of pixel driving circuit islands, and two ends of remaining clusters of the second roundabouts are respectively electrically connected to two pixel driving circuit islands symmetrically disposed with one another in the first group of pixel driving circuit islands and the second group of pixel driving circuit islands.

10. The display panel as claimed in claim 4, wherein two ends of each group of the second roundabouts extend from one side of the second symmetric axis to opposite two sides of the first symmetric axis, and each terminal of each group of the second roundabouts is divided into at least two clusters of the second roundabouts of different lengths on one side of the first symmetric axis, and at least two clusters of the second roundabouts of different lengths on opposite sides of the first symmetric axis extend to a position corresponding to the at least part of the pixel driving circuit islands of the first group of pixel driving circuit islands and the second group of pixel driving circuit islands.

11. The display panel as claimed in claim 10, wherein the display panel further comprises a plurality of connecting lines, the connecting lines and the second roundabouts are formed on different layers, and each cluster of the second roundabouts is electrically connected to one pixel driving circuit island in the first group of pixel driving circuit islands and the second group of pixel driving circuit islands by the connecting lines.

12. The display panel as claimed in claim 4, wherein the display panel further comprises a display area, a plurality of first sector areas, and a plurality of second sector areas, the display area is disposed at a periphery of the functional additional area, the plurality of first sector areas and the plurality of second sector areas are both disposed on the display area and surrounding the functional additional area; and, each of the first signal lines comprises a first straight segment of the display area and a first transition of the first sector areas, each of the second signal lines comprises a second straight segment of the display area and a second transition of the second sector areas, the first straight segment extends from the display area to the first sector areas to be electrically connected to the first transition, the second straight segment extends from the display area to the second sector areas to be electrically connected to the second transition, the first transition is one-to-one electrically connected to the first roundabouts, and the second transition is one-to-one electrically connected to the second roundabouts.

13. The display panel as claimed in claim 12, wherein a plurality of second display pixels are disposed on the display area, the display panel further comprises a fourth group of pixel driving circuit islands, the fourth group of pixel driving circuit islands is disposed on the display area near the functional additional area, each pixel driving circuit islands of the fourth group of pixel driving circuit islands comprises a plurality of first pixel driving circuits, and at least part of the first pixel driving circuits of the fourth group of pixel driving circuit islands are used for driving the second display pixels of the plurality of first sector areas and the plurality of second sector areas to illuminate.

14. The display panel as claimed in claim 12, wherein a plurality of second display pixels are disposed on the display area, a plurality of second display pixel circuits further are disposed on the display area to drive the plurality of second display pixels of the display area to illuminate, and an area of the display panel occupied by each first pixel driving circuits is less than an area of the display panel occupied by each of the second pixel driving circuits.

15. The display panel as claimed in claim 14, wherein a sum of device areas of each of the first pixel driving circuits is less than a sum of device areas of each of the second pixel driving circuits; and/or, a sum of number of devices of each of the first pixel driving circuits is less than a sum of number of devices of each of the second pixel driving circuits; and/or, an average wiring area of each of the first pixel driving circuits is less than an average wiring area of each of the second pixel driving circuits, wherein the device comprises at least one of switching units or capacitors, and the wiring comprises a plurality of signal wirings.

16. The display panel as claimed in claim 1, wherein the first signal lines are at least one of gate lines or reset lines, and the second signal lines are data lines.

17. The display panel as claimed in claim 1, wherein at least part of the first pixel driving circuits of at least part of the pixel driving circuit islands is electrically connected to the plurality of first display pixels by a transparent line.

18. An electronic device, comprising a display panel and a photosensitive unit, wherein the display panel comprises a functional additional area comprising at least one display light-transmissive area;

a plurality of first display pixels disposed on the at least one display light-transmissive area;

a plurality of pixel driving circuit islands, a plurality of first signal lines, and a plurality of second signal lines disposed at a periphery of the at least one display light-transmissive area;

each of pixel driving circuit islands comprising a plurality of first pixel driving circuits;

the plurality of first signal lines and the plurality of second signal lines are both electrically connected to the plurality of first pixel driving circuits of the plurality of pixel driving circuit islands;

at least part of the first pixel driving circuits of at least part of the pixel driving circuit islands is used for driving the plurality of first display pixels in the at least one display light-transmissive area to illuminate;

wherein an interval between two adjacent first pixel driving circuits of each of the pixel driving circuit islands is smaller than an interval between any two adjacent first display pixels, and an interval between two adjacent pixel driving circuit islands is greater than the interval between any two adjacent first display pixels; and the photosensitive unit is disposed on one side of the display panel and disposed corresponding to the functional additional area.

19. The electronic device as claimed in claim 18, wherein an area of each of the at least one display light-transmissive area ranges from 0.32 mm$^2$ to 120 mm$^2$.

* * * * *